(12) United States Patent
Zaderej et al.

(10) Patent No.: US 11,083,088 B2
(45) Date of Patent: Aug. 3, 2021

(54) MICRO POWER DISTRIBUTION BOXES AND METHODS OF MANUFACTURING SAME USING APPLICATION SPECIFIC ELECTRONICS PACKAGING TECHNIQUES

(71) Applicant: Molex, LLC, Lisle, IL (US)

(72) Inventors: Victor Zaderej, Oregon, IL (US); Rand Wilburn, Noblesville, IN (US); David Dunham, Metamora, MI (US); Richard Fitzpatrick, Chicago, IL (US); E. H. Cheong, Palatine, IL (US)

(73) Assignee: Molex, LLC, Lisle, IL (US)

( * ) Notice: Subject to any disclaimer, the term of this patent is extended or adjusted under 35 U.S.C. 154(b) by 171 days.

(21) Appl. No.: 16/481,490

(22) PCT Filed: Jul. 5, 2017

(86) PCT No.: PCT/US2017/040736
§ 371 (c)(1),
(2) Date: Jul. 29, 2019

(87) PCT Pub. No.: WO2018/009554
PCT Pub. Date: Jan. 11, 2018

(65) Prior Publication Data
US 2020/0196451 A1 Jun. 18, 2020

Related U.S. Application Data

(60) Provisional application No. 62/359,275, filed on Jul. 7, 2016.

(51) Int. Cl.
*H05K 1/18* (2006.01)
*H02G 3/08* (2006.01)
(Continued)

(52) U.S. Cl.
CPC ............ *H05K 1/184* (2013.01); *H01R 43/24* (2013.01); *H02G 3/081* (2013.01);
(Continued)

(58) Field of Classification Search
USPC ........................................................ 361/728
See application file for complete search history.

(56) References Cited

U.S. PATENT DOCUMENTS 9,281,607 B2 * 3/2016 Lee .................. H05K 5/062
10,433,428 B2 * 10/2019 Spiegel .............. H05K 1/0393
(Continued)

FOREIGN PATENT DOCUMENTS

CN 202737168 U 2/2013
CN 202840188 U 3/2013
(Continued)

OTHER PUBLICATIONS

Office action receive for Korean patent application No. 10-2019-7003653, dated May 25, 2020, 27 pages. (14 pages of english translation and 13 pages of original copy).
(Continued)

*Primary Examiner* — Hung S. Bui

(57) ABSTRACT

A micro power distribution box is provided which includes a device, a connector/housing and a cover. The device has a substrate, at least one first finger, at least one second finger, and at least one electrical component. The at least one first finger and the at least one second finger are electrically connected to one another. The at least one first finger has first, second and third portions. The at least one second finger has first and second portions. The substrate is overmolded to the first portions of the at least one first and second fingers. The substrate is not overmolded to the second portions of the at least one first and second fingers or to the third portion of the at least one first finger. The second
(Continued)

portions of the at least one first and second fingers extend outwardly from the substrate. The second portion of the at least one first finger is a high current contact. The second portion of the at least one second finger is a contact pin. The third portion of the at least one first finger is exposed via an aperture provided through the substrate. The at least one electrical component is directly mounted to the third portion of the at least one first finger in order to electrically connect the at least one electrical component to the at least one first finger. The connector/housing is configured to house the device therein and is configured to be connected to a mating connector. The cover is configured to be secured to the connector/housing in a manner which prevents the device from being removed from the connector/housing.

18 Claims, 15 Drawing Sheets

(51) Int. Cl.
| | | |
|---|---|---|
| *H05K 1/02* | (2006.01) | |
| *H05K 3/00* | (2006.01) | |
| *H05K 3/18* | (2006.01) | |
| *H05K 3/20* | (2006.01) | |
| *H05K 3/24* | (2006.01) | |
| *H05K 3/30* | (2006.01) | |
| *H05K 5/00* | (2006.01) | |
| *H01R 43/24* | (2006.01) | |

(52) U.S. Cl.
CPC ......... *H05K 1/0284* (2013.01); *H05K 3/0097* (2013.01); *H05K 3/185* (2013.01); *H05K 3/202* (2013.01); *H05K 3/241* (2013.01); *H05K 3/306* (2013.01); *H05K 5/0069* (2013.01); H05K 5/0047 (2013.01); H05K 2201/0141 (2013.01); H05K 2201/09118 (2013.01); *H05K 2201/10053* (2013.01); *H05K 2201/10166* (2013.01); *H05K 2201/10181* (2013.01); *H05K 2203/107* (2013.01); *H05K 2203/1327* (2013.01)

(56) References Cited

U.S. PATENT DOCUMENTS

| | | |
|---|---|---|
| 2003/0227764 A1 | 12/2003 | Korczynski |
| 2010/0231038 A1 | 9/2010 | Sugimura et al. |
| 2011/0005826 A1 | 1/2011 | Hashikura et al. |
| 2012/0043660 A1 | 2/2012 | Poddar et al. |
| 2015/0016028 A1 | 1/2015 | Darr et al. |

FOREIGN PATENT DOCUMENTS

| | | |
|---|---|---|
| CN | 104241999 A | 12/2014 |
| JP | H05-251845 A | 9/1993 |
| JP | H08-18170 A | 1/1996 |
| JP | H08-64916 A | 3/1996 |
| JP | H10-502519 A | 3/1998 |
| JP | 2002-094216 A | 3/2002 |
| JP | 2005-348495 A | 12/2005 |
| JP | 2006-024620 A | 1/2006 |
| WO | 2009/113631 A1 | 9/2009 |
| WO | 2017/004064 A1 | 1/2017 |
| WO | 2018/009554 A1 | 1/2018 |

OTHER PUBLICATIONS

International Search Report and Written Opinion received for PCT application No. PCT/US2017/040736, dated Oct. 13, 2017, 9 pages.
International Preliminary Report on Patentability received for PCT Application No. PCT/US2017/040736, dated Jan. 17, 2019, 8 pages.
Notification of Reasons for refusal received for JP application No. 2019-500325, dated Feb. 4, 2020, 13 pages. (7 pages of English translation and 6 pages of official copy).

* cited by examiner

MICRO POWER DISTRIBUTION BOXES AND METHODS OF MANUFACTURING SAME USING APPLICATION SPECIFIC ELECTRONICS PACKAGING TECHNIQUES

RELATED APPLICATIONS

This application claims priority to PCT Application No. PCT/US2017/040736, filed on Jul. 5, 2017, which further claims priority to U.S. Provisional Patent Application No. 62/359,275, filed on Jul. 7, 2016, which are incorporated herein by reference in their entirety.

TECHNICAL FIELD

This disclosure relates to electronic devices and the manufacturing of such devices. More specifically, this disclosure relates to micro power distribution boxes and the manufacturing thereof using application specific electronics packaging techniques.

BACKGROUND ART

Molded interconnect devices ("MIDs") are three-dimensional electromechanical parts that typically include plastic components and electronic circuit traces. A plastic substrate or housing is created and electrical circuits and devices are plated, layered, or implanted upon the plastic substrate. MIDs typically have fewer parts than conventionally produced devices, which results in space and weight savings. Applications for MID devices include mobile telephones, automated teller machines, steering wheel components for automobiles, RFID components, lighting, medical devices, and many consumer goods.

Current processes for manufacturing MIDs include two-shot molding and laser direct structuring (LDS). Two-shot molding involves the use of two separate plastic parts, one platable and one non-platable. The platable part forms the circuitry, and the non-platable part fulfills mechanical functions and completes the molding. The two parts are fused together and circuits are created through use of electroless plating. The platable plastic is metallized, while the non-platable plastic remains non-conductive. LDS, in contrast, involves the steps of injection molding, laser activation of the plastic material, and then metallization. The laser etches a wiring pattern onto the part and prepares it for metallization. With LDS, only a single thermoplastic material is required thereby making the molding step a one-shot process.

There is a need, however, for an improved system and process for rapidly and efficiently manufacturing three dimensional structures that can include a combination of components. In particular, there is a need to add electronics packages into smaller spaces to include more features that operate at higher speeds, while simultaneously using less power and reducing heat, all at a reduced manufacturing cost.

One example of a need for an improved system and process for rapidly and efficiently manufacturing three dimensional structures is in connection with the manufacture of micro power distribution boxes (PDBs). A micro PDB is a reduced size module that is typically used to control electrical power within next generation vehicles, whether automotive, commercial, construction or otherwise. As vehicles become more and more "electrified," the need for controlling power increases. By distributing the capability of controlling the power as opposed to doing all of the controls from a centralized location, cabling, power loss, and total cost can be minimized.

One of the most significant challenges in the design of micro PDBs is how to deal with the heat generated within the module due to the very high currents that the system must carry. In order to carry the 50 Amp or higher currents that are often required to be controlled, very "large" contacts are used. These contacts are often soldered to printed circuit boards (PCBs) that are made with thick traces up to five ounces of copper (0.2 mm thick copper). The reason that these very thick traces and contacts are used is that the "Ohmic Heating" associated with high current connections is calculated by squaring the current being carried and multiplied by the resistance in the current path. In effect, a 50 Amp current carried in a path with 10 milliohms of resistance results in 25 Watts of heat energy.

Thus, there is a need for an improved micro PDB and improved method of manufacturing same.

SUMMARY OF THE PRESENT DISCLOSURE

A first preferred embodiment of the disclosure provides a micro power distribution box that includes a connector, a housing and a device formed by an Application Specific Electronics Packaging manufacturing process. The housing is secured to the connector. The device has a substrate, at least one finger and at least one electrical component. The substrate is secured to the connector. The substrate has at least one aperture provided therethrough. The substrate is overmolded to a first portion of the at least one finger. The at least one aperture of the substrate exposes a second portion of the at least one finger. The at least one electrical component is electrically connected to the second portion of the at least one finger through the at least one aperture of the substrate.

The at least one electrical component of the first preferred embodiment of the micro power distribution box is preferably a high-powered field-effect transistor, an internal microprocessor, or a relay and a fuse.

The device of the first preferred embodiment of the micro power distribution box preferably has first and second fingers. The first and second fingers have third portions. The substrate is not overmolded to the third portions of the first and second fingers. The third portions extend outwardly from the substrate. The third portion of the first finger may be a high current contact or a contact pin. When the third portion of the first finger is a contact pin, the second finger does not have a second portion which is exposed via the at least one aperture of the substrate.

The Application Specific Electronics Packaging manufacturing process used to form the device of the first preferred embodiment of the micro power distribution box preferably includes the steps of: forming a continuous carrier web having a plurality of lead frames, each lead frame defining an opening and having at least one finger which extends into the opening; overmolding a substrate onto the fingers of each lead frame; electrically connecting the at least one electrical component to the at least one finger of each lead frame to form a plurality of devices; and singulating one of the devices from the continuous carrier web.

The substrate of the first preferred embodiment of the micro power distribution box is preferably formed of a thermally conductive liquid crystal polymer.

A second preferred embodiment of the disclosure provides a micro power distribution box that is prepared by a process that includes the steps of: forming a continuous carrier web having a plurality of lead frames, each lead frame defining an opening and having a plurality of fingers which extend into the opening; overmolding a substrate onto the fingers of each lead frame; electrically connecting an electrical component to at least one of the fingers of each lead frame to form a plurality of devices, each device having at least one electrical component; singulating one of the devices from the continuous carrier web; securing the device to a connector; and securing a housing to the connector.

The at least one electrical component of the second preferred embodiment of the micro power distribution box is preferably a high-powered field-effect transistor, an internal microprocessor, or a relay and a fuse.

The substrate of the second preferred embodiment of the micro power distribution box is preferably formed of a thermally conductive liquid crystal polymer.

A third preferred embodiment of the disclosure provides a method of forming a micro power distribution box, which method includes the steps of: forming a continuous carrier web having a plurality of lead frame, each lead frame defining an opening and having a plurality of fingers which extend into the opening; overmolding a substrate onto the fingers of each lead frame, each substrate having at least one aperture provided therethrough which exposes at least a portion of one of the fingers; electrically connecting an electrical component to the exposed portion of fingers of each lead frame via the at least one aperture of the substrate to form a plurality of devices, each device having at least one electrical component; singulating one of the devices from the continuous carrier web; securing the device to a connector; and securing a housing to the connector.

A fourth preferred embodiment of the disclosure provides a micro power distribution box that includes a device formed by an Application Specific Electronics Packaging manufacturing process and a housing. The device has a substrate, at least one finger and at least one electrical component. The substrate is formed as a connector. The substrate has at least one aperture provided therethrough. Each finger has an aperture provided therethrough. The substrate is overmolded to at least portions of the at least one finger whereby the at least one aperture of the substrate is in alignment with a corresponding aperture of the at least one finger. The at least one electrical component is electrically connected to the at least one finger through the at least one aperture of the substrate. The housing is secured to the connector.

The at least one electrical component of the fourth preferred embodiment of the micro power distribution box is preferably a high-powered field-effect transistor or an internal microprocessor.

The substrate of the fourth preferred embodiment of the micro power distribution box is preferably formed of a thermally conductive liquid crystal polymer.

The at least one finger of the fourth preferred embodiment of the micro distribution box has a high current contact portion. The substrate is not overmolded to the high current contact portion of the at least one finger.

The Application Specific Electronics Packaging manufacturing process used to form the device of the fourth preferred embodiment of the micro distribution box includes the steps of: forming a continuous carrier web having a plurality of lead frames, each lead frame defining an opening and having at least one finger which extends into the opening; overmolding a substrate onto the fingers of each lead frame; electrically connecting at least one electrical component to the at least one finger of each lead frame to form a plurality of devices; and singulating one of the devices from the continuous carrier web.

A fifth preferred embodiment provides a micro power distribution box that is prepared by a process that includes the steps of: forming a continuous carrier web having a plurality of lead frames, each lead frame defining an opening and having at least one finger which extends into the opening; overmolding a substrate onto the fingers of each lead frame, the substrate being formed as a connector; electrically connecting at least one electrical component to the at least one finger of each lead frame to form a plurality of devices, each device having at least one electrical component, the at one electrical component comprising a high-powered field-effect transistor; singulating one of the devices from the continuous carrier web; and securing a housing to the connector.

The substrate of the fifth preferred embodiment of the micro power distribution box is preferably formed of a thermally conductive liquid crystal polymer.

A sixth preferred embodiment provides a method of forming a micro power distribution box, the method including the steps of: forming a continuous carrier web having a plurality of lead frames, each lead frame defining an opening and having at least one finger which extends into the opening; overmolding a substrate onto the fingers of each lead frame, the substrate being formed as a connector, each substrate having at least one aperture provided therethrough which expose a portion of the at least one finger; electrically connecting at least one electrical component to the at least one finger of each lead frame via the at least one aperture of the substrate to form a plurality of devices, each device having at least one electrical component, the at least one electrical component comprising a high-powered field-effect transistor; singulating one of the devices from the continuous carrier web; and securing a housing to the connector.

A seventh preferred embodiment provides a micro power distribution box that includes a device, a connector/housing, and a cover. The device has a substrate, at least one first finger, at least one second finger, and at least one electrical component. The at least one first finger and the at least one second finger are electrically connected to one another. The at least one first finger has first, second and third portions. The at least one second finger has first and second portions. The substrate is overmolded to the first portions of the at least one first and second fingers. The substrate is not overmolded to the second portions of the at least one first and second fingers or to the third portion of the at least one first finger. The second portions of the at least one first and second fingers extend outwardly from the substrate. The second portion of the at least one first finger is a high current contact. The second portion of the at least one second finger is a contact pin. The third portion of the at least one first finger is exposed via an aperture provided through the substrate. The at least one electrical component is directly mounted to the third portion of the at least one first finger in order to electrically connect the at least one electrical component to the at least one first finger. The connector/housing is configured to house the device therein and is configured to be connected to a mating connector. The cover is configured to be secured to the connector/housing in a manner which prevents the device from being removed from the connector/housing.

The at least one electrical component of the seventh preferred embodiment of the micro power distribution box is preferably a high-powered field-effect transistor or an internal microprocessor.

The substrate of the seventh preferred embodiment of the micro power distribution box is preferably formed of a thermally conductive liquid crystal polymer.

The device of the seventh preferred embodiment of the micro power distribution box is preferably formed by an Application Specific Electronics Packaging manufacturing process.

The at least one first finger and the at least one second finger of the seventh preferred embodiment of the micro power distribution box are preferably electrically connected to one another via a bus bar. The substrate is preferably overmolded to the bus bar.

The seventh preferred embodiment of the micro power distribution box preferably further includes a gasket which is secured between the cover and the connector/housing.

DETAILED DESCRIPTION

The present disclosure is directed to improvements in the design and manufacture of micro power distribution boxes (micro PDBs). The micro PDBs of the present disclosure are preferably manufactured using an Application Specific Electronics Packaging ("ASEP") system and method. The process is useful for the creation of devices such as printed circuit boards, flex circuits, connectors, thermal management features, EMI Shielding, high current conductors, RFID apparatuses, antennas, wireless power, sensors, MEMS apparatuses, LEDs, microprocessors and memory, ASICs, passives, and other electrical and electro-mechanical apparatuses. ASEP manufacturing processes have previously been described and illustrated in International Application No. PCT/US16/39860, filed on Jun. 28, 2016, the disclosure of which is incorporated herein by reference.

Figure 1:
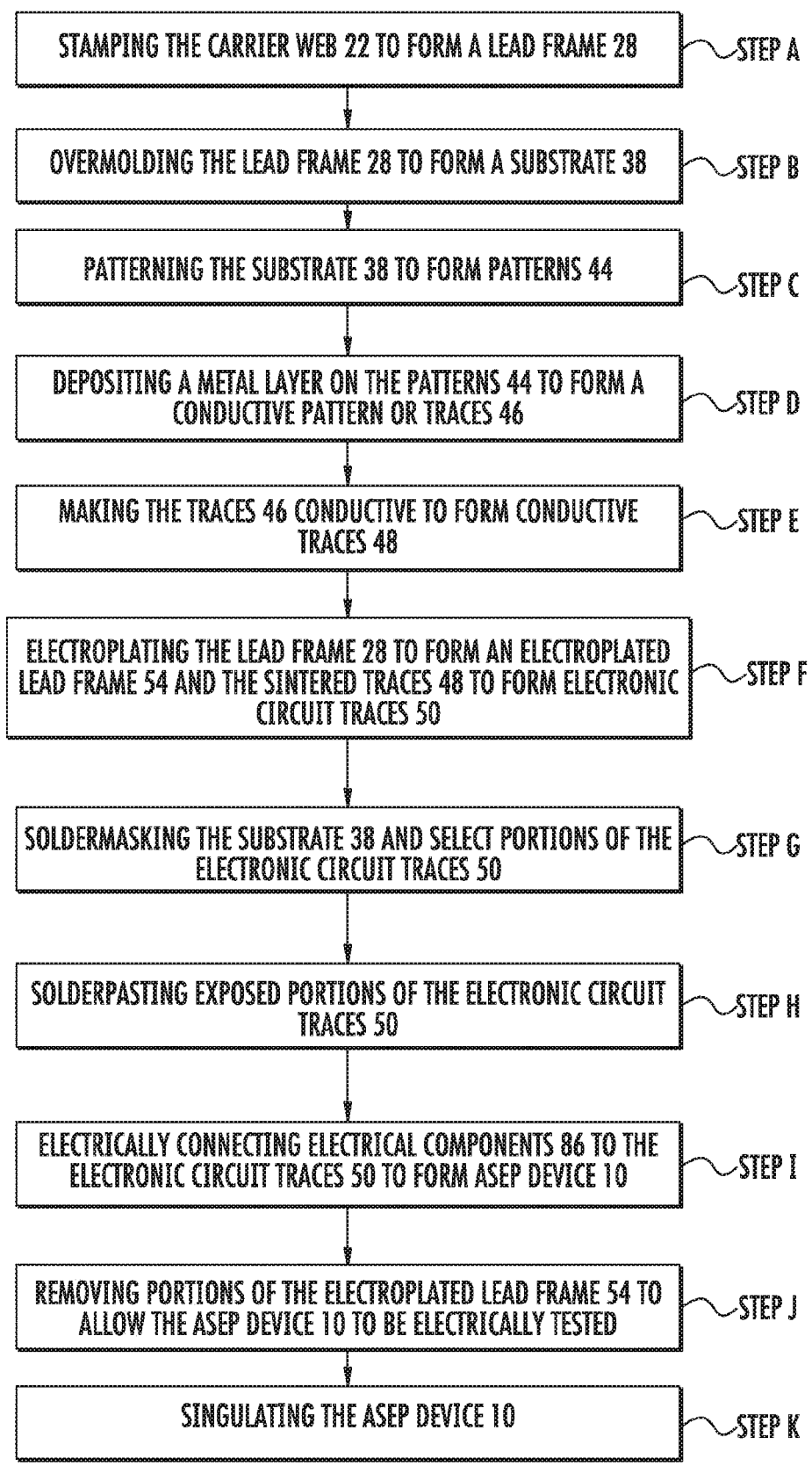
FIG. 1 is a flow chart showing the steps of an embodiment of an ASEP manufacturing process.
Figure 2:
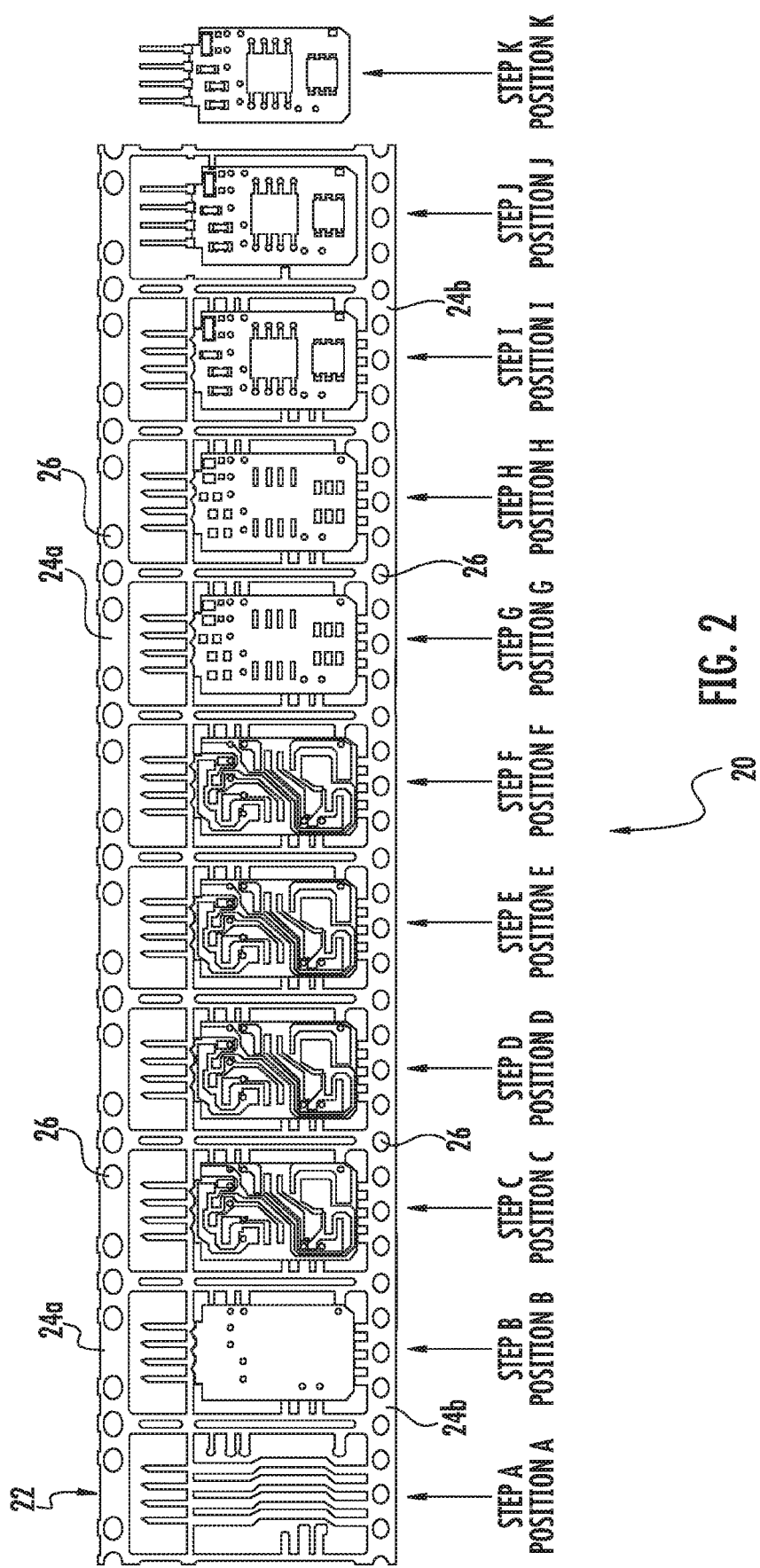
FIG. 2 is a flow diagram of the steps of the embodiment of the ASEP manufacturing process.
Figure 2A:
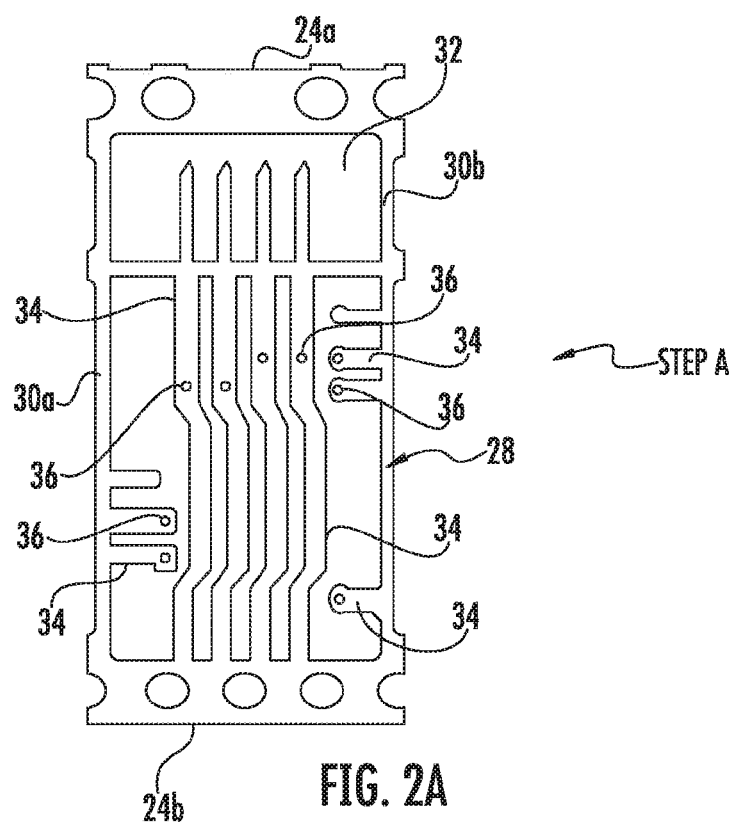
FIGS. 2A-2K are expanded view of the individual steps of the flow diagram of FIG. 2.
Figure 2B:
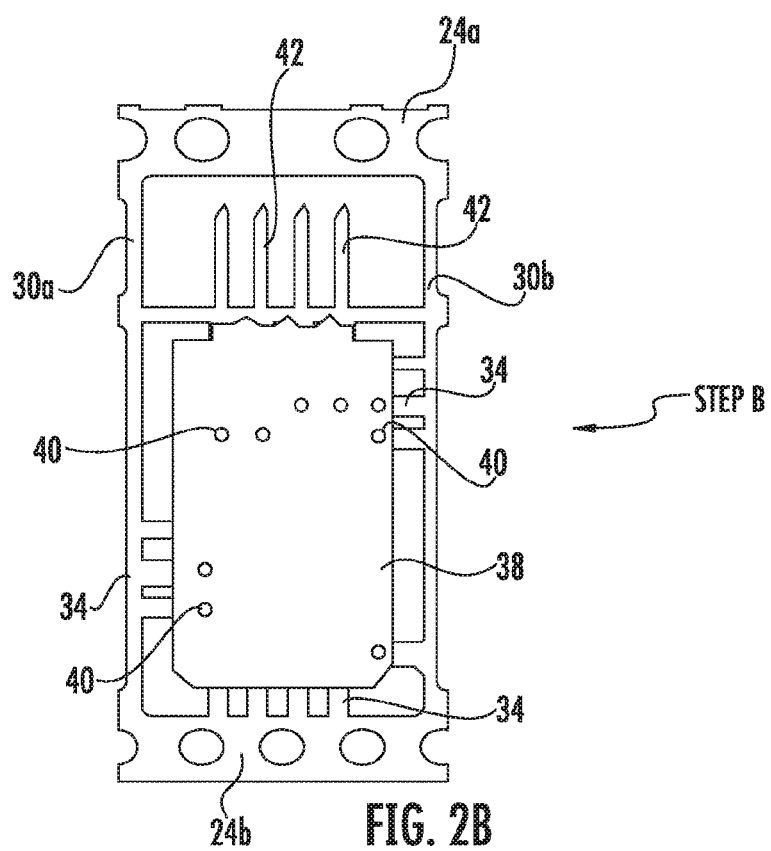

FIG. 1 illustrates a flow chart for a preferred embodiment of an ASEP manufacturing process 20 for building an ASEP device 10. FIG. 2 illustrates a flow diagram of the ASEP manufacturing process 20, which ASEP manufacturing process 20 includes Steps A-K. FIGS. 2A-2K provide enlarged images of Steps A-K, where FIG. 2A illustrates Step A, FIG. 2B illustrates Step B, and so forth.

Advantageously, manufacturing process 20 is preferably continuous for speed and cost reasons. Reel-to-reel technology, such as illustrated in FIG. 2 allows the ASEP device 10 to be formed while attached to a carrier web 22. The carrier web 22 is preferably unspooled from a first (bulk source) reel (not shown) and then, if desired, collected in a second (take-up) reel (not shown), with the manufacturing process 20 taking place between the first and second reels. The carrier web 22 has opposite end portions 24a, 24b and a middle portion (not shown) which spans the distance between the opposite end portions 24a, 24b. The end portions 24a, 24b have carrier holes 26 extending therethrough. The carrier holes 26 allow the carrier web 22 to traverse along a manufacturing line in a continuous flow, like a conveyor belt, between the first and second reels. The carrier web 22 is preferably formed of any desirable conductive metal, such as copper alloy, but may alternatively be formed of polyimide flex materials, such as a flexible circuit with one or more layers (in certain embodiments the flex materials can have four or more layers).

As illustrated in FIGS. 1, 2 and 2A, manufacturing process 20 begins with Step A, where Step A occurs at Position A, which is located between the first and second reels, and after the first reel. In Step A, the middle portion of the carrier web 22 is stamped (thus removing undesired portions of the middle portion of the carrier web 22) to form a lead frame 28. The lead frame 28 is formed in a desired configuration suited for the formation of the ASEP device 10. As best illustrated in FIG. 2A, the lead frame 28 preferably includes the end portions 24a, 24b (it being understood that the end portions 24a, 24b of one lead frame 28 are continuous with the end portions 24a, 24b of the adjacent lead frame 28), a pair of stabilizing portions 30a, 30b (it being understood that stabilizing portion 30a of one lead frame 28 will also preferably act as stabilizing portion 30b of the adjacent lead frame 28), with each stabilizing portion 30a, 30b spanning the distance between the opposite end portions 24a, 24b (which end portions 24a, 24b are preferably not subject to the stamping of Step A). The opposite end portions 24a, 24b and the stabilizing portions 30a, 30b thus generally form a rectangular frame which defines an opening 32 therebetween. The lead frame 28 also preferably includes a plurality of fingers 34 which are connected to any one of the opposite end portions 24a, 24b and the stabilizing portions 30a, 30b and which extend inwardly into the opening 32. Each finger 34 may have one or more apertures 36 provided therethrough.

As illustrated in FIGS. 1, 2 and 2B, manufacturing process 20 continues with Step B, where Step B occurs at Position B, which is located between the first and second reels and after Position A. In Step B, a substrate 38 is overmolded to the fingers 34 of the lead frame 28. The substrate 38 may have apertures 40 provided therethrough which preferably align with the apertures 36 of the fingers 34. As illustrated in FIG. 2B, certain portions 42 of the fingers 34 do not have the substrate 38 overmolded thereto, and are not otherwise connected to any one of the opposite end portions 24a, 24b and the stabilizing portions 30a, 30b. These certain portions 42 may act as contact pins of the ASEP device 10 to be formed. The overmolding of Step B can be performed with single or two shot processes, or any other conventional molding process.

Figure 2C:
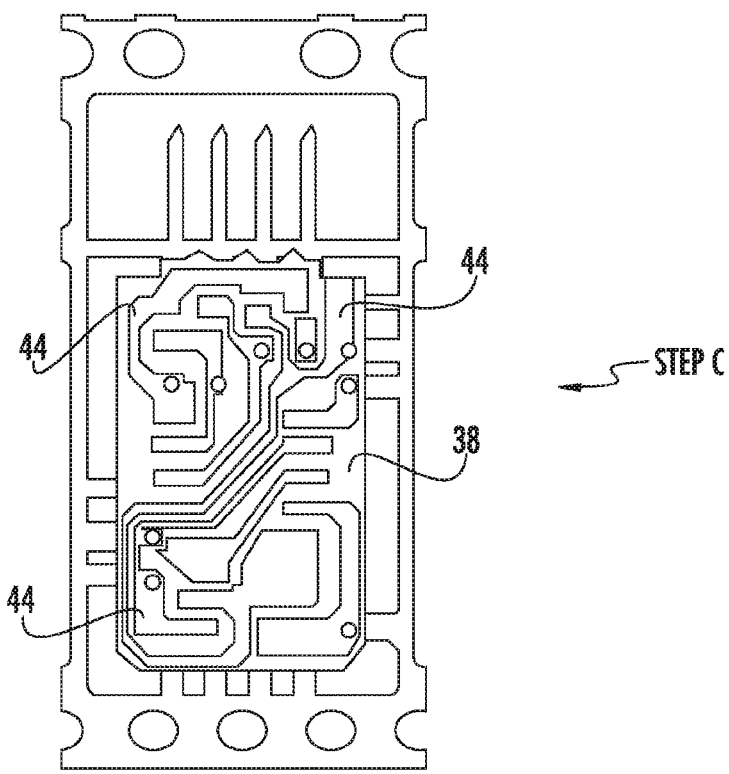

As illustrated in FIGS. 1, 2 and 2C, manufacturing process 20 continues with Step C, where Step C occurs at Position C, which is located between the first and second reels and after Position B. In Step C, patterning is performed on the substrate 38. The patterning provides for one or more patterns 44 (which may be circuit patterns) to be formed on the surface of the substrate 38. The patterns 44 can be formed by any number of suitable processes, including a laser process, a plasma process (which can be a vacuum or atmospheric process), a UV process and/or a fluorination process. Depending on the process used (e.g., plasma, UV and/or fluorination), the patterning may comprise patterning (i.e., a surface treatment of) most, if not all, of the surface of the substrate 38. Thus, the patterns 44 may be formed on all or nearly all of the surface of the substrate 38.

Figure 2D:
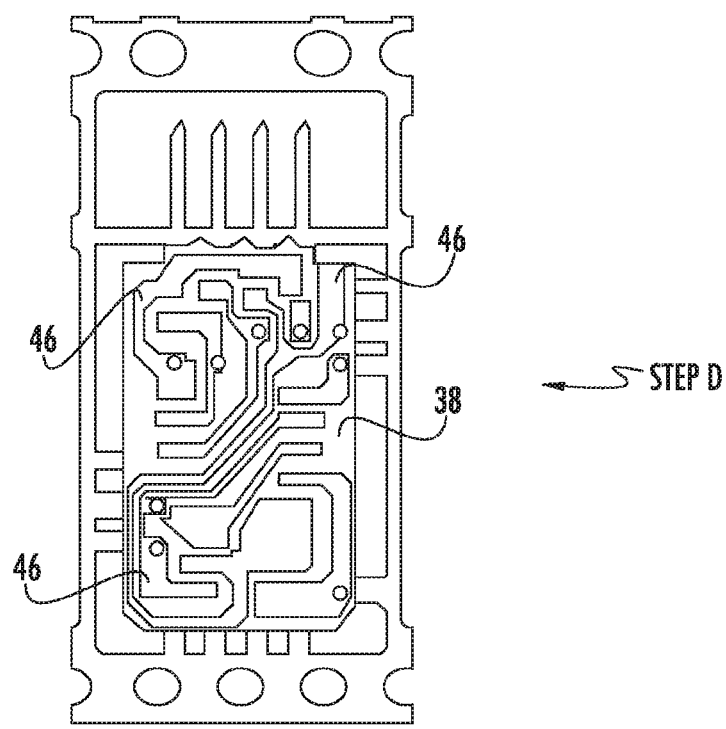

As illustrated in FIGS. 1, 2 and 2D, manufacturing process 20 continues with Step D, where Step D occurs at Position D, which is located between the first and second reels and after Position C. In Step D, a metal layer (commonly referred to as a seed layer) is deposited on all or part of the patterns 44 (typically all when the patterns 44 are formed by a laser process, and typically a part of when the patterns 44 are formed by plasma, UV and/or fluorination processes) and connected to the substrate 38, which metal layer provides a conductive pattern or traces 46. The traces 46 also are provided along the walls of the apertures 40, 36, thus electrically connecting the traces 46 to the fingers 34, and thus to the remainder of the lead frame 28 as well. The deposition of the metal layer may be performed by any suitable process, including an electroless plating process, an ink jet process, a screening process, or an aerosol process. Depending on the process used, the metal to be deposited may be in any suitable form, including ink or paste. The metal to be deposited preferably has high conductivity and low binder content so as to increase its conductivity. The metal to be deposited further preferably has high chemical stability in plating baths and a viscosity that is compatible with the desired deposition process. While not illustrated, it is to be understood that portions of the fingers 34 can act as internal buss(es) which are electrically connected to the traces 46 on the surface of the substrate 38.

Figure 2E:
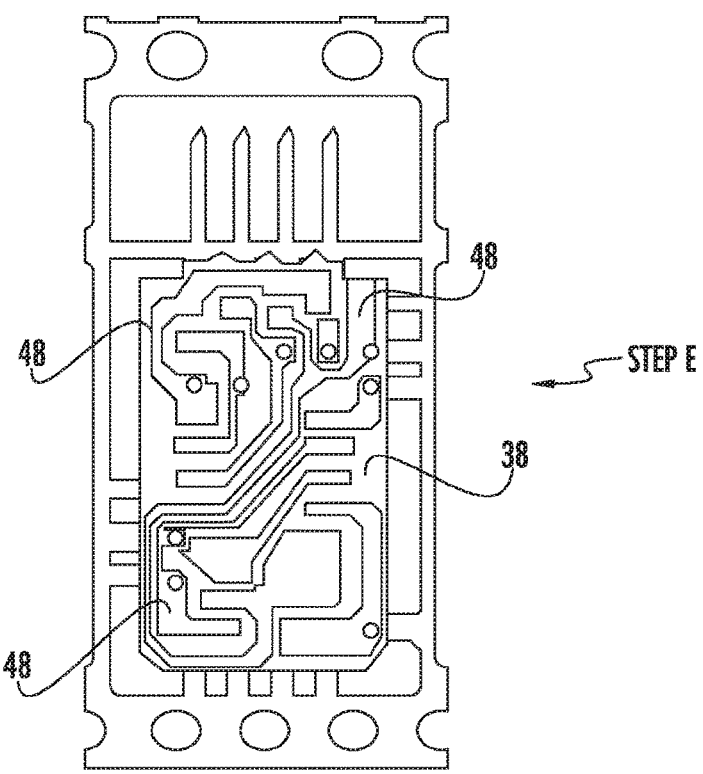

As illustrated in FIGS. 1, 2 and 2E, manufacturing process 20 continues with Step E, where Step E occurs at Position E, which is located between the first and second reels and after Position D. In Step E, the traces 46 are made conductive (sintered), thereby forming conductive traces 48. The sintering process can be performed by a laser or by flash heat, or any other desirable process that provides sufficient thermal energy, for instance to fuse the particles (e.g., nano or micron in size) in an ink or paste. Sintering helps insure that the deposited metal forming the traces 46 adheres to the substrate 38 and also ensures that the deposited metal is conductive (as it often is the case that the deposited metal as applied is not sufficiently conductive to allow for a voltage potential to be applied to the traces 46). As can be appreciated, if Step D is performed with an electroless plating process, then Step E does not need to be performed, as there is no need to sinter the electroless plating.

It should further be noted that, if both Step C and Step E are performed using lasers, that a preferred system and process would have multiple lasers integrated into a single station/position, thereby saving space in the manufacturing process 20 and helping to ensure that laser is properly registered. In addition, the integration of multiple lasers in a single station/position enables faster processing of the material.

Figure 2F:
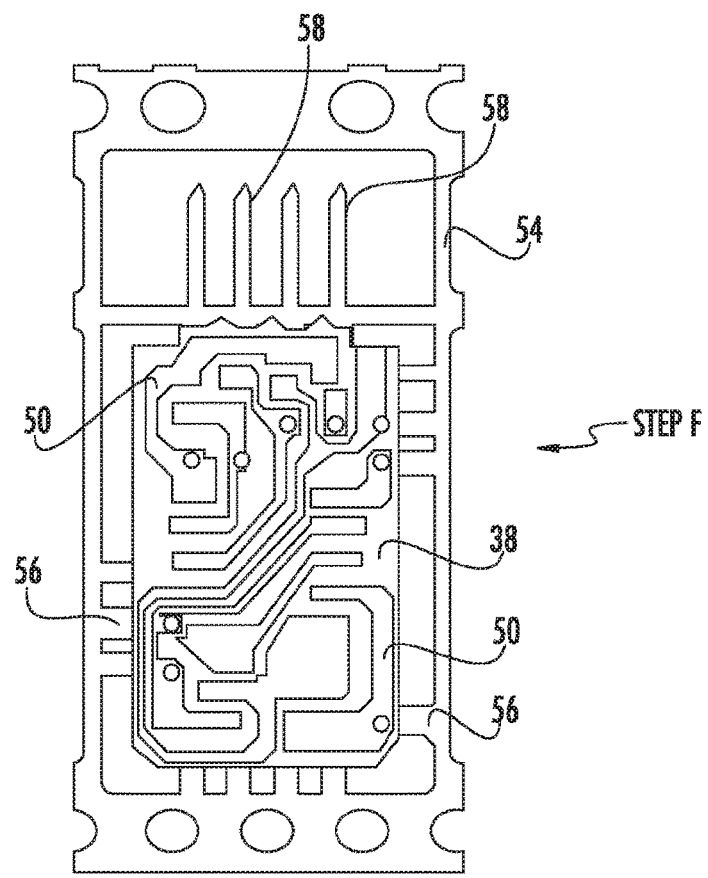

As illustrated in FIGS. 1, 2 and 2F, manufacturing process 20 continues with Step F, where Step F occurs at Position F, which is located between the first and second reels and after Position E. In Step F, the traces 46/conductive traces 48 are electroplated by applying a voltage potential to the lead frame 28 (which is electrically connected to the traces 46/conductive traces 48 via the internal buss(es) and then exposing the lead frame 28, the substrate 38 and the traces 46/conductive traces 48 to an electroplating bath. The electroplating process not only electroplates the traces 46/conductive traces 48 to form electronic circuit traces 50, but electroplates the lead frame 28 to form an electroplated lead frame 54, which has electroplated fingers 56 having electroplated contact pin portions 58. Step F can involve a single step plating process which builds up a single layer of a single material, such as copper, or can involve a multi-step plating process which builds up multiple layers of multiple materials, such as a copper layer and a tin layer, it being understood that other suitable materials could also be used. The increased thickness allows for increased current carrying capability and, in general, the electroplating process tends to create a material that has a high conductivity, such that the performance of the resultant electronic circuit traces 50 is improved.

The connection of the traces 46 to the internal buss(es) enables electroplating of all metals, including copper, nickel, gold, silver, tin, lead, palladium, and other materials. The process of forming traces 46 which are connected to the internal buss(es) and then electroplating enables faster deposition of metals than known electroless plating processes. In addition, the plating process is smoother and lower cost when implemented using reel-to-reel technology as compared with more conventional batch processes.

In another embodiment, techniques such as those included in Mesoscribe technology may be used to deposit a full thickness of copper (or other conductive material) on a surface. A picosecond laser may then be used to isolate desired conductive patterns in the conductive material. Such an approach could be used in place of Step F, as described herein, or in addition to Step F, where one or more plated materials are desired.

Steps C, D, E, and F may be used on a Syndiotactic Polystyrene (SPS) provided by XAREC and provide good retention of the electronic circuit traces 50 to the surface of the substrate 38.

Figure 2G:
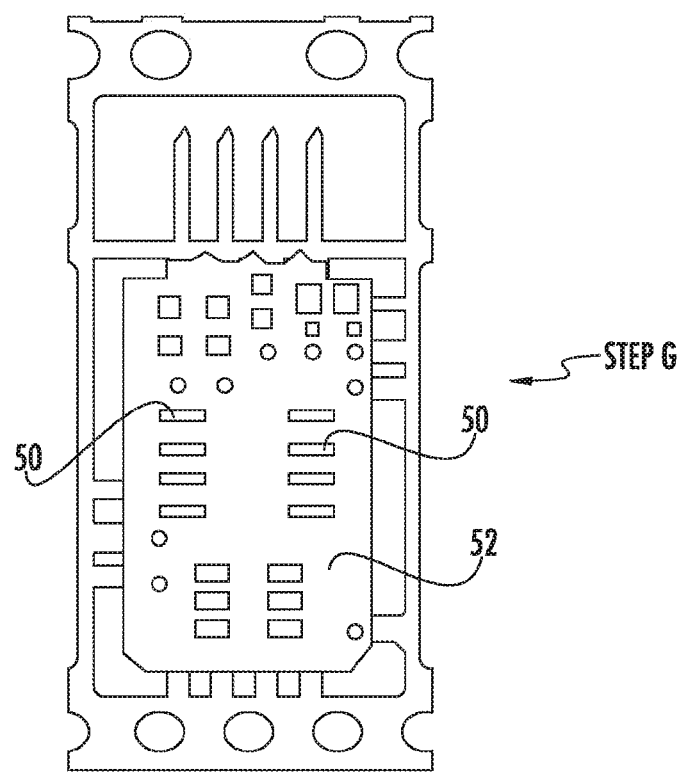

As illustrated in FIGS. 1, 2 and 2G, manufacturing process 20 continues with Step G, where Step G occurs at Position G, which is located between the first and second reels and after Position F. In Step G, a solder mask 52 is applied which covers select portions of the electronic circuit traces 50 and all, or substantially all, of the exposed surfaces of the substrate 38.

Figure 2H:
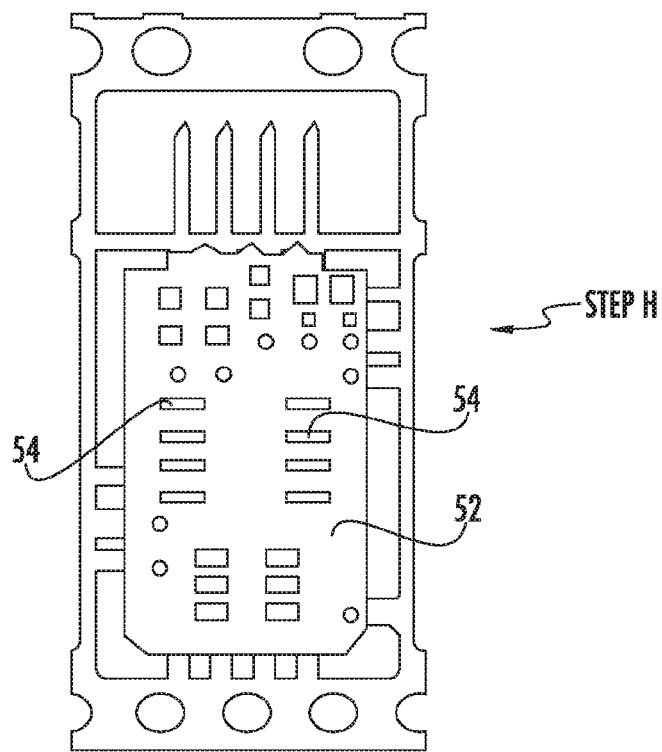

As illustrated in FIGS. 1, 2 and 2H, manufacturing process 20 continues with Step H, where Step H occurs at Position H, which is located between the first and second reels and after Position G. In Step H, solderpaste 54 is stenciled onto the exposed portions of the electronic circuit traces 50 (namely those portions not covered by the solder mask 52).

Figure 2I:
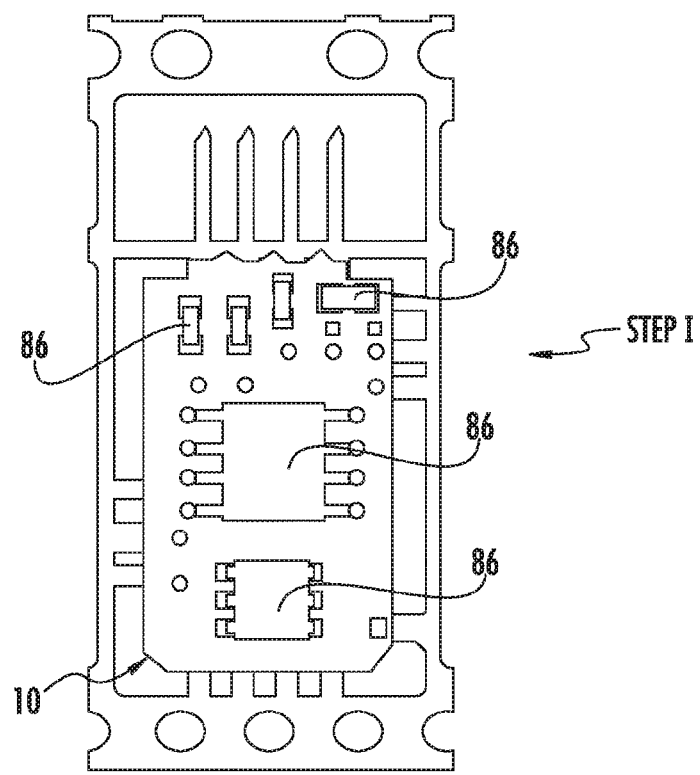

As illustrated in FIGS. 1, 2 and 2I, manufacturing process 20 continues with Step I, where Step I occurs at Position I, which is located between the first and second reels and after Position H. In Step I, electrical components 86 are positioned on the solderpaste 54 in order to electrically connect the electrical components 86 to the electronic circuit traces 50. With the electrical components 86 being position on the solderpaste 54, a reflow process may then be used to form the ASEP device 10. It should be noted that the electrical components 86 may alternatively, or in addition to Steps G and H, be wire-bonded to the electronic circuit traces 50.

Figure 2J:
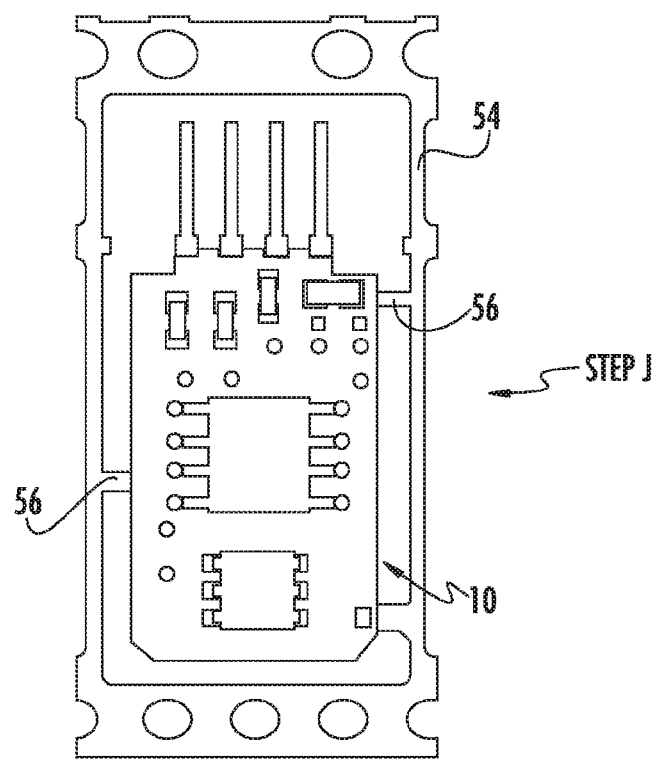

As illustrated in FIGS. 1, 2 and 2J, manufacturing process 20 continues with Step J, where Step J occurs at Position J, which is located between the first and second reels and after Position I. In Step J, a majority of the remaining exposed electroplated fingers 56 that are connected to the "frame" of the electroplated lead frame 54 are punched/removed, leaving only a necessary amount (for example, two, as illustrated in FIG. 2J) of exposed electroplated fingers 56 still connected to the "frame" of the electroplated lead frame 54. At this point, if desired, the formed ASEP device 10 can be electrically tested.

Figure 2K:
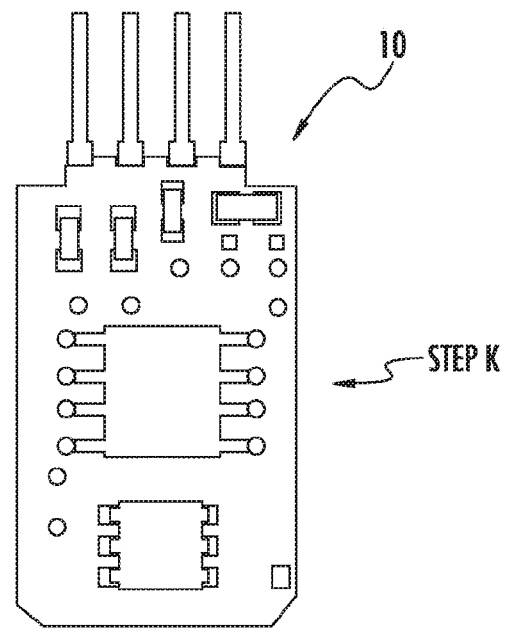

As illustrated in FIGS. 1, 2 and 2K, manufacturing process 20 continues with Step K, where Step K occurs at position K, which is located outside of the first and second reels. In Step K, once the ASEP device 10 is formed, in order for the ASEP device 10 to be used it must be removed from the carrier web 22, in order to singulate the ASEP device 10, where, thereafter, the singulated ASEP device 10 can used as desired, for instance as a part of a final assembly (not shown).

The ASEP device 10 allows for an integrated device that can be formed in a substantially additive manner. As electroplating is a relatively effective process, a reciprocating path through a plating bath with a relatively short dwell time of less than thirty minutes may be sufficient, thus allowing the total process to be less than an hour while enabling a complex set of geometries and configurations. Naturally, adding additional layers of plating may add to the total time of the manufacturing process but still should provide for substantial reductions in total time, from end to end, compared to conventional processes that use PCBs.

It is to be appreciated that in certain applications not all of Steps A-K will be needed. It is to be further appreciated that in certain applications the order of Steps A-K may be modified as appropriate. It is to be further appreciated that in certain applications the order of Positions A-K may be modified as appropriate and, in some applications, some of the Positions A-K may be identical to other of the Positions A-K.

It should also be appreciated that while the drawings only show the manufacturing process 20 being applied to one side of the substrate 38, that the manufacturing process 20 may be equally applied to the other sides of the substrate 38, as well as to internal layers. It should be noted that the use of a metal carrier web 22 may result in a structure that is best suited for applications where there are just two layers (one on both sides of the substrate 38) in addition to the metal carrier web 22. If there is a desire for additional layers then it has been determined that the use of a carrier web 22 formed of a polyimide flex may be more beneficial for allowing additional internal layers to be added.

Various embodiments are described above with reference to ASEP device 10, however, these are just examples of devices that may be formed using ASEP techniques. Through ASEP, it is possible to integrate connectors, sensors, LEDs, thermal management, antennas, RFID devices, microprocessors, memory, impedance control, and multi-layer functionality directly into a product.

Figure 3:
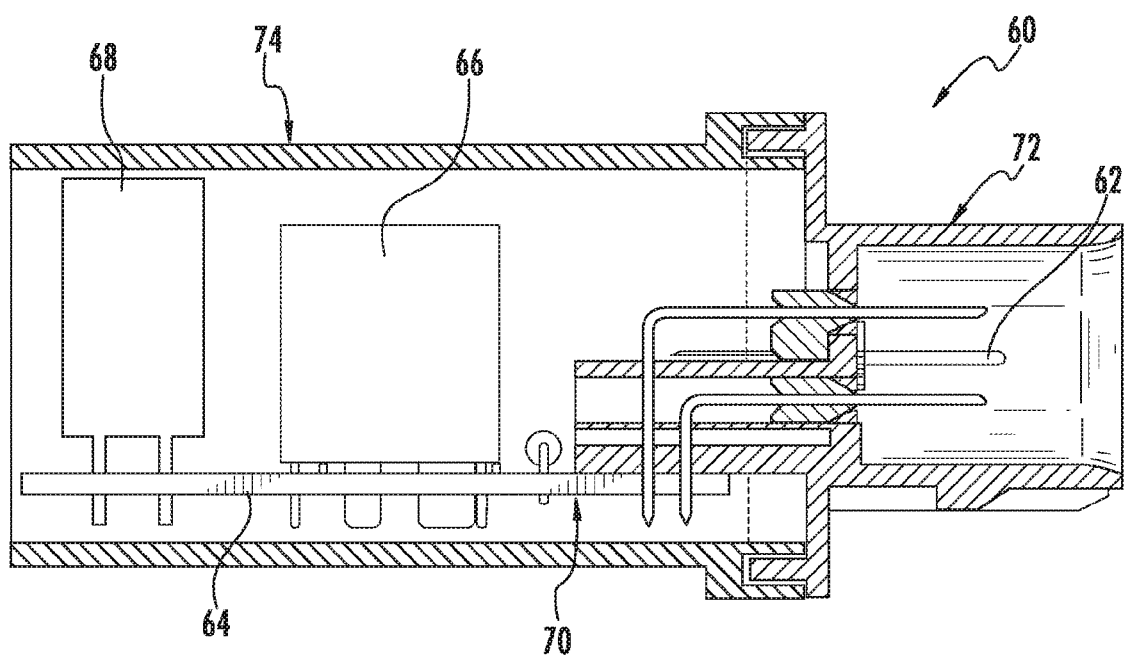
FIG. 3 is a cross-sectional view of a micro power distribution box that is currently being developed by Applicant.

With regard to the manufacture of micro PDBs, a micro PDB 60 currently being developed by Applicant (which is not totally or partially formed by using ASEP techniques), provides an improvement over micro PDBs of the prior art. The micro PDB 60 is illustrated in FIG. 3. The larger six mm blades 62 are used to conduct up to 40 Amps of current to a PCB 64 with four ounces of copper. The traces on the PCB 64 interconnect a relay 66 and a fuse 68. The blades 62, the PCB 64, the relay 66, and the fuse 68 form an assembly 70 which is secured to a connector 72. A housing 74 is secured to the connector 72 and further protects the assembly 70. In this current micro PDB 60, there are six sets of solder joints as well as significant path lengths of four ounces of copper. However, due to the very temperatures that are created within the micro PDB 60, limitations are created as to how much the system can carry at various ambient temperatures. If the temperatures become too high, the system could fail. Despite the foregoing, certain individuals are requesting ways to further increase the amount of current the micro PDB can carry up to 50 Amps and above.

In order to achieve the desired level of current carrying capability, namely 50 Amps and above, the resistances in the system must be reduced. One way to achieve this goal is to reduce the bulk and contact resistances between the contact at one of the micro PDB, through the relay and fuse, and to contact on the other end of the system. The best way to achieve this goal is to minimize the thermal resistance through the conductors between the two contacts. This includes the bulk resistances of the conductors between the two external contacts as well as the number and quality of the contact interfaces (i.e., removable contacts and solder joints).

In a first embodiment of a micro PDB 160, which is partially formed using a modified ASEP manufacturing process 120, the number of solder joints are reduced from six sets to four sets, and the four ounces of copper PCB are entirely replaced with the same thickness conductor (0.8 mm) as the high current contact, thereby eliminating the higher resistance associated with the PCB. It is anticipated that the path resistance associated with the micro PDB 160 could reduce the resistance by as much as 50%, thereby allowing the system to run "cooler" at the same input currents or to increase the current that the system could ultimately carry.

The micro PDB 160 is partially achieved by using ASEP technology whereby the connector contacts, PCB circuit traces, and all of the necessary components are integrated in such a way that the interfaces between the connector, a PCB, and the components are minimized By extending the contact materials used to make the high-power contacts directly to the relay, the interfaces between the contacts and the PCB can be eliminated.

Figure 4:
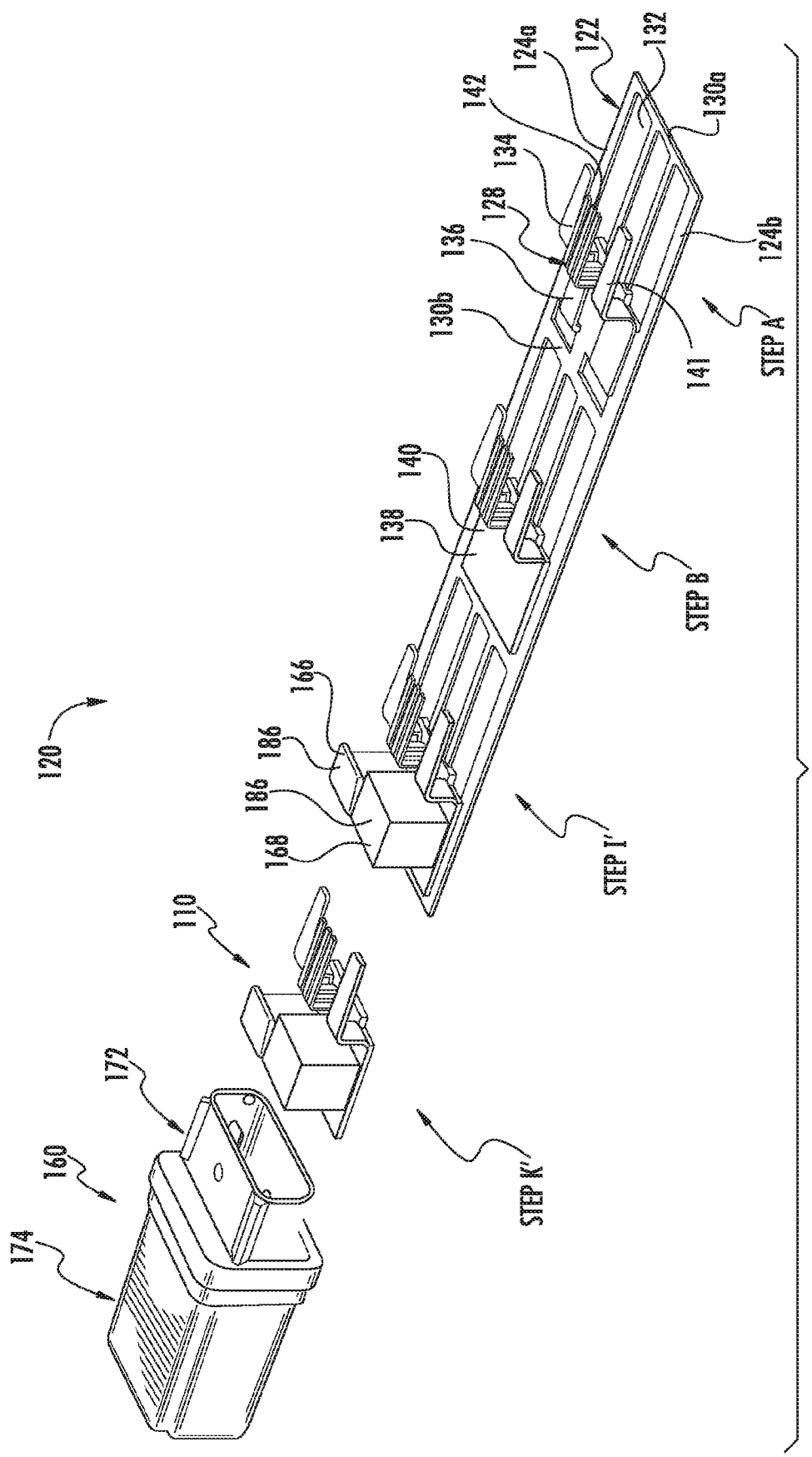
FIG. 4 is a flow diagram of the steps of forming a first embodiment of a micro power distribution box, where the micro power distribution box includes a modified ASEP device formed by a modified ASEP manufacturing process.

Attention is directed to FIG. 4 which illustrates the formation of an ASEP device 110 using the modified ASEP manufacturing process 120, where the formed ASEP device 110 is then used as part of the micro PDB 160. The modified ASEP manufacturing process 120 includes Steps A and B of the ASEP manufacturing process 20, as well as Steps I' and K' which are modifications of Steps I and K of the ASEP manufacturing process 20.

As illustrated in FIG. 4, manufacturing process 120 begins with Step A. Like manufacturing process 20, manufacturing process 120 preferably occurs between a pair of reels, although due to the size of the ASEP device 110 being formed, it is to be understood that the ASEP device 110 may need to be removed from the carrier web 122 prior to reaching the take-up reel. In Step A, the middle portion of the carrier web 122 is stamped (thus removing undesired portions of the middle portion of the carrier web 122) to form a lead frame 128. The lead frame 128 is formed in a desired configuration suited for the formation of the ASEP device 110. The lead frame 128 preferably includes the end portions 124a, 124b (it being understood that the end portions 124*a*, 124*b* of one lead frame 128 are continuous with the end portions 124*a*, 124*b* of the adjacent lead frame 128), a pair of stabilizing portions 130*a*, 130*b* (it being understood that stabilizing portion 130*a* of one lead frame 128 will also preferably act as stabilizing portion 130*b* of the adjacent lead frame 128), with each stabilizing portion 130*a*, 130*b* spanning the distance between the opposite end portions 124*a*, 124*b* (which end portions 124*a*, 124*b* are preferably not subject to the stamping of Step A). The opposite end portions 124*a*, 124*b* and the stabilizing portions 130*a*, 130*b* thus generally form a rectangular frame which defines an opening 132 therebetween.

The lead frame 128 also preferably includes a plurality of fingers 134 which are connected to any one of the opposite end portions 124*a*, 124*b* and the stabilizing portions 130*a*, 130*b* and which extend inwardly into the opening 132. Each finger 134 may have one or more apertures 136 provided therethrough. In the formation of the ASEP device 110, it is understood that the fingers 134 form a plurality of blades (high current contacts) 141 and a plurality of contact pins 142.

As illustrated in FIG. 4, manufacturing process 120 continues with Step B. In Step B, a substrate 138 is overmolded to the fingers 134 of the lead frame 128, but not to the blades 141 or the contact pins 142. The substrate 138 may have apertures 140 provided therethrough which preferably align with the apertures 136 of the fingers 134.

As illustrated in FIG. 4, manufacturing process 120 continues with Step I'. In Step I', electrical components 186 are electrically connected to the fingers 134—through the apertures 140 of the substrate 138, in any number of known manners, thereby forming the ASEP device 110. The electrical components 186 of the ASEP device 110 preferably include a relay 166 and a fuse 168.

As illustrated in FIG. 4, manufacturing process 120 continues with Step K. In Step K, once the ASEP device 110 is formed, in order for the ASEP device 10 to be used it must be removed from the carrier web 122, in order to singulate the ASEP device 110.

Once the ASEP device 110 is singulated, the ASEP device 110 can be secured to a connector 172, and a housing 174 can be secured to the connector 172, thereby forming the micro PDB 160, as illustrated in FIG. 4.

Several newer technologies have recently become available that, when combined, can dramatically increase the performance, size, and cost of next generation micro PDB assemblies. These two technologies are high powered FET (field-effect transistor) devices and ASEP technology. The high-power FET devices, such as the Smart High or Low-Side Power Switches manufactured and sold by Infineon, have very low resistances when they are on and high resistances when off, and can switch up to 80 Amps. By integrating the high-power FET devices into micro PDB designs that use ASEP technology to interconnect the FETs, driver circuits, and passive devices into one compact and higher integrated package, it is possible to create a new generation of power control devices that will be dramatically "better in all ways."

Figure 5:
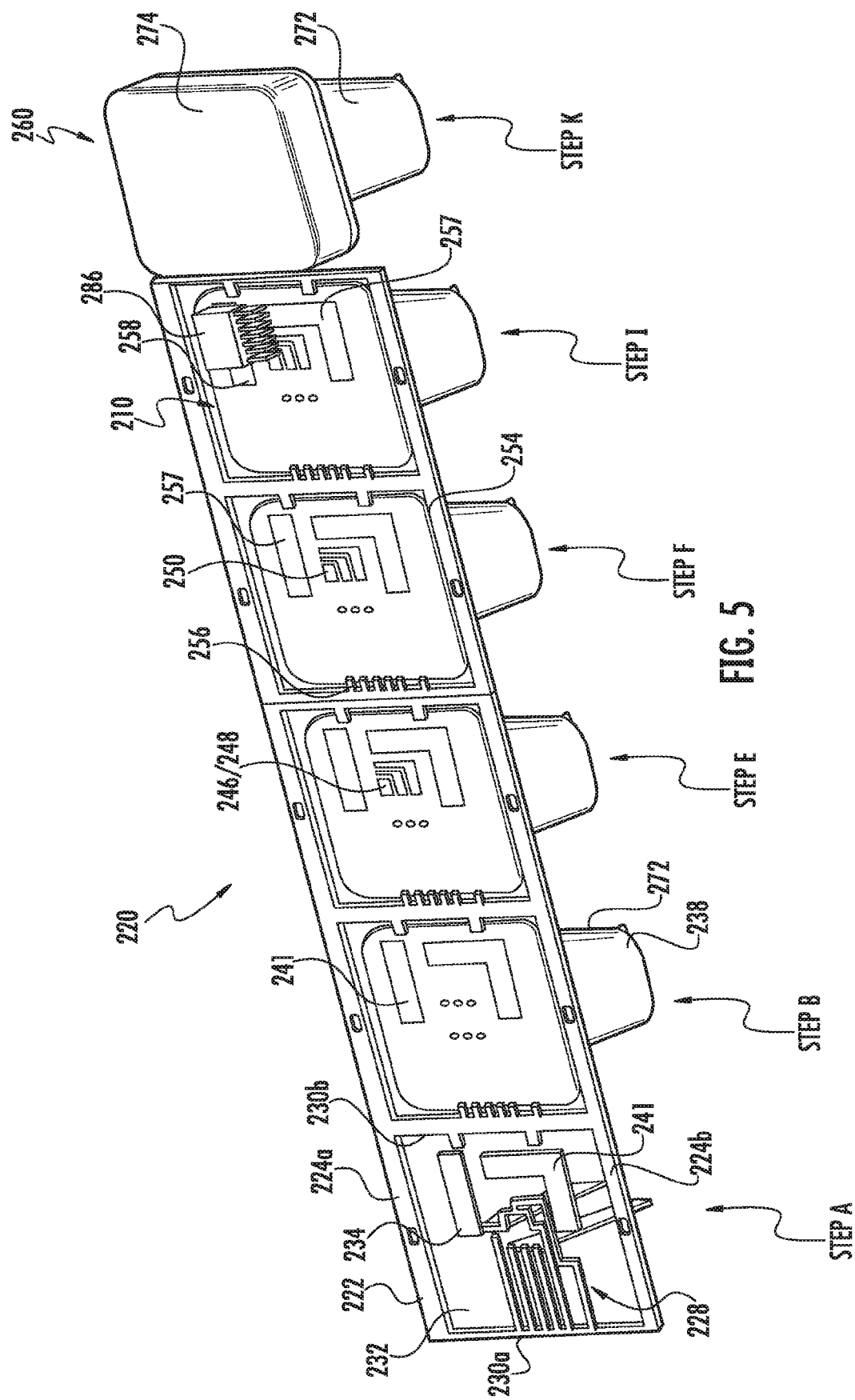
FIG. 5 is a flow diagram of the steps of forming a second embodiment of a micro power distribution box, where the micro power distribution box includes an ASEP device formed by an ASEP manufacturing process.

A second embodiment of a micro PDB 260 is partially formed using an ASEP manufacturing process 220. Attention is directed to FIG. 5 which illustrates the formation of an ASEP device 210 using the ASEP manufacturing process 220, where the formed ASEP device 210 is then used as part of the micro PDB 260. The ASEP manufacturing process 220 preferably includes each of the Steps A-K of the ASEP manufacturing process 20, but for brevity purposes, FIG. 5 does not illustrate each and every one of Steps A-K, as will be discussed below.

As illustrated in FIG. 5, manufacturing process 220 begins with Step A. Like manufacturing process 20, manufacturing process 220 preferably occurs between a pair of reels, although due to the size of the ASEP device 210 being formed, it is to be understood that the ASEP device 210 may need to be removed from the carrier web 222 prior to reaching the take-up reel. In Step A, the middle portion of the carrier web 222 is stamped (thus removing undesired portions of the middle portion of the carrier web 222) to form a lead frame 228. The lead frame 228 is formed in a desired configuration suited for the formation of the ASEP device 210. The lead frame 228 preferably includes the end portions 224*a*, 224*b* (it being understood that the end portions 224*a*, 224*b* of one lead frame 228 are continuous with the end portions 224*a*, 224*b* of the adjacent lead frame 228), a pair of stabilizing portions 230*a*, 230*b* (it being understood that stabilizing portion 230*a* of one lead frame 228 will also preferably act as stabilizing portion 230*b* of the adjacent lead frame 228), with each stabilizing portion 230*a*, 230*b* spanning the distance between the opposite end portions 224*a*, 224*b* (which end portions 224*a*, 224*b* are preferably not subject to the stamping of Step A). The opposite end portions 224*a*, 224*b* and the stabilizing portions 230*a*, 230*b* thus generally form a rectangular frame which defines an opening 232 therebetween.

The lead frame 228 also preferably includes a plurality of fingers 234 which are connected to any one of the opposite end portions 224*a*, 224*b* and the stabilizing portions 230*a*, 230*b* and which extend inwardly into the opening 232. In the formation of the ASEP device 210, it is understood that some of the fingers 234 form high current contacts 241.

As illustrated in FIG. 5, manufacturing process 220 continues with Step B. In Step B, a substrate 238 is overmolded to the fingers 234 of the lead frame 228. The substrate 238 preferably has apertures provided therethrough which preferably expose different portions of the fingers 234, including portions of the high current contacts 241. In this manufacturing process 220, the substrate 238 formed is the connector 272 of the micro PDB 260.

Manufacturing process 220 continues with Steps C, D, and E (patterning, metal deposition to form traces, and, if performed, making the traces conductive (sintering) to form conductive traces), but only the result of Step E is illustrated in FIG. 5, namely the provision of the traces 246/conductive traces 248 on the substrate 238.

As illustrated in FIG. 5, manufacturing process 220 continues with Step F. In Step F, the traces 246/conductive traces 248 are electroplated by applying a voltage potential to the lead frame 228 (which is electrically connected to the traces 246/conductive traces 248 via internal buss(es) and then exposing the lead frame 228, the substrate 238 and the traces 246/conductive traces 248 to an electroplating bath. The electroplating process not only electroplates the traces 246/conductive traces 248 to form electronic circuit traces 250, but electroplates the lead frame 228 to form an electroplated lead frame 254, which has electroplated fingers 256 having electroplated high current contacts 257.

Manufacturing process 220 continues with Steps G and H (soldermasking and solderpasting), but FIG. 5 does not illustrate these steps. It is further to be understood that, if desired, Steps G and H could be omitted from manufacturing process 220.

As illustrated in FIG. 5, manufacturing process 220 continues with Step I. In Step I, electrical components 286 are electrically connected to the electroplated high current contacts 257 and the electronic circuit traces 250, which preferably occurs via soldering. Thus, the electrical components 286 are mounted directly to the contacts 257 and the traces 250 such that the heat and electrical path have very low thermal resistance. As such, temperature can be controlled much better than on a standard PCB. As noted above, the electrical component 286 preferably includes at least a high-power FET, such as those manufactured and sold by Infineon.

Manufacturing process 220 continues with Step J, but FIG. 5 does not illustrate this step.

As illustrated in FIG. 5, manufacturing process 220 continues with Step K. In Step K, once the ASEP device 210 is formed (which incorporates the connector 272), in order for the ASEP device 210 to be used it must be removed from the carrier web 222, in order to singulate the ASEP device 210.

Once the ASEP device 210 is singulated, a housing 274 can be secured to the connector 272 of the ASEP device 210, thereby forming the micro PDB 260, as illustrated in FIG. 5. It should be appreciated that, due to the ASEP manufacturing process 220, the size of the housing 274 as compared to the size(s) of the housings 74, 174 is greatly reduced.

Figure 6:
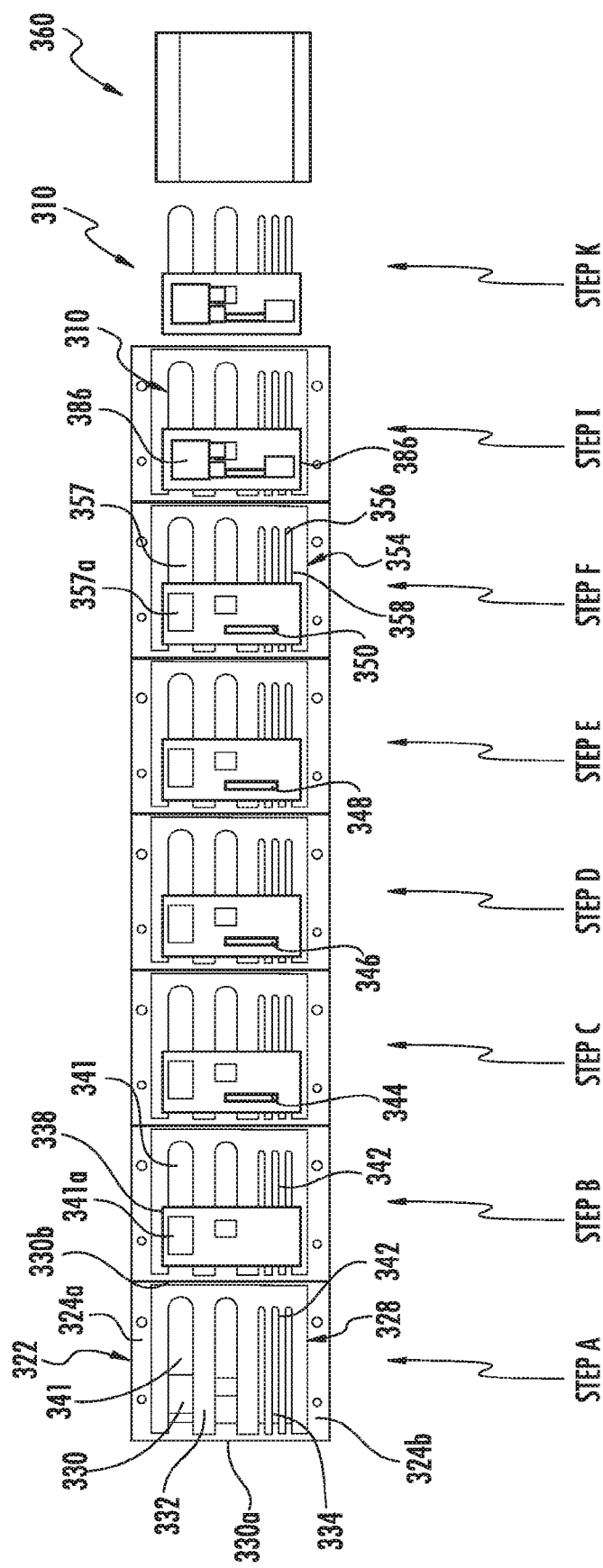
FIG. 6 is a flow diagram of the steps of forming a third embodiment of a micro power distribution box, where the micro power distribution box includes an ASEP device formed by an ASEP manufacturing process.

A third embodiment of a micro PDB 360 is partially formed using an ASEP manufacturing process 320. Attention is directed to FIG. 6 which illustrates the formation of an ASEP device 310 using the ASEP manufacturing process 320, where the formed ASEP device 310 is then used as part of the micro PDB 360. The ASEP manufacturing process 320 preferably includes each of the Steps A-K of the ASEP manufacturing process 20, but for brevity purposes, FIG. 6 does not illustrate each and every one of Steps A-K, as will be discussed below.

As illustrated in FIG. 6, manufacturing process 320 begins with Step A. Like manufacturing process 20, manufacturing process 320 preferably occurs between a pair of reels, although due to the size of the ASEP device 310 being formed, it is to be understood that the ASEP device 310 may need to be removed from the carrier web 322 prior to reaching the take-up reel (although ASEP device 310 is preferably sized such that removal from the carrier web 322 prior to reaching the take-up reel would not be required). In Step A, the middle portion of the carrier web 322 is stamped (thus removing undesired portions of the middle portion of the carrier web 322) to form a lead frame 328. The lead frame 328 is formed in a desired configuration suited for the formation of the ASEP device 310. The lead frame 328 preferably includes the end portions 324a, 324b (it being understood that the end portions 324a, 324b of one lead frame 328 are continuous with the end portions 324a, 324b of the adjacent lead frame 328), a pair of stabilizing portions 330a, 330b (it being understood that stabilizing portion 330a of one lead frame 328 will also preferably act as stabilizing portion 330b of the adjacent lead frame 328), with each stabilizing portion 330a, 330b spanning the distance between the opposite end portions 324a, 324b (which end portions 324a, 324b are preferably not subject to the stamping of Step A). The opposite end portions 324a, 324b and the stabilizing portions 330a, 330b thus generally form a rectangular frame which defines an opening 332 therebetween.

The lead frame 328 also preferably includes a plurality of fingers 334 which are connected to any one of the opposite end portions 324a, 324b and the stabilizing portions 330a, 330b and which extend inwardly into the opening 332. In the formation of the ASEP device 310, it is understood that some of the fingers 334 form high current contacts 341 and some of the fingers 334 form contact pins 342.

As illustrated in FIG. 6, manufacturing process 320 continues with Step B. In Step B, a substrate 338 is overmolded to the fingers 334 of the lead frame 328. The substrate 338 may have apertures (not shown) provided therethrough which preferably expose different portions of the fingers 334, including portions 341a of the high current contacts 341.

Manufacturing process 320 continues with Steps C, D, and E (patterning, metal deposition to form traces, and making the traces conductive (sintering) to form conductive traces), and for brevity purposes, and in accordance with the foregoing description of the manufacturing process 20, in FIG. 6, Step C results in a pattern 344, Step D results in a trace 346, and Step E results in a conductive trace 348

As illustrated in FIG. 6, manufacturing process 320 continues with Step F. In Step F, the traces 346/conductive traces 348 are electroplated by applying a voltage potential to the lead frame 328 (which is electrically connected to the traces 346/conductive traces 348 via internal buss(es) and then exposing the lead frame 328, the substrate 338 and the traces 346/conductive traces 348 to an electroplating bath. The electroplating process not only electroplates the traces 346/conductive traces 348 to form electronic circuit traces 350, but electroplates the lead frame 328 to form an electroplated lead frame 354, which has electroplated fingers 356 having electroplated high current contacts 357, with portions 357a thereof that are exposed via the apertures of the substrate 338, and electroplated contact pins 358.

Manufacturing process 320 continues with Steps G and H (soldermasking and solderpasting), but FIG. 6 does not illustrate these steps.

As illustrated in FIG. 6, manufacturing process 320 continues with Step I. In Step I, electrical components 386 are electrically connected to the exposed portions 357a of the electroplated high current contacts 357 and the electronic circuit traces 350, which preferably occurs via soldering. Thus, the electrical components 386 are mounted directly to the contacts 357 and the traces 350 such that the heat and electrical path have very low thermal resistance. As such, temperature can be controlled much better than on a standard PCB. Like in manufacturing process 220, the electrical component 386 preferably includes at least a high-power FET, such as those manufactured and sold by Infineon.

Manufacturing process 320 continues with Step J, but FIG. 6 does not illustrate this step.

As illustrated in FIG. 6, manufacturing process 320 continues with Step K. In Step K, once the ASEP device 310 is formed, in order for the ASEP device 310 to be used it must be removed from the carrier web 322, in order to singulate the ASEP device 310.

Once the ASEP device 310 is singulated, the ASEP device 310 can be assembled/connected into a completely redesigned connector/housing 375, to form the micro PDB 360. The micro PDB 360 would have an even smaller footprint/profile than the micro PDB 260, which as noted is already greatly reduced as compared to the micro PDBs 60, 160.

Figure 7:
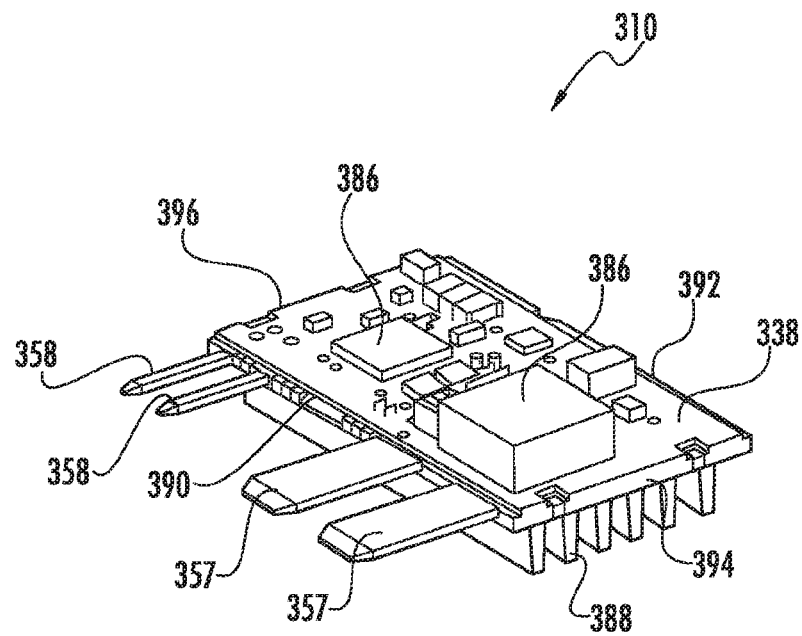
FIG. 7 is a perspective view of the ASEP device of the third embodiment of the micro power distribution box.
Figure 8:
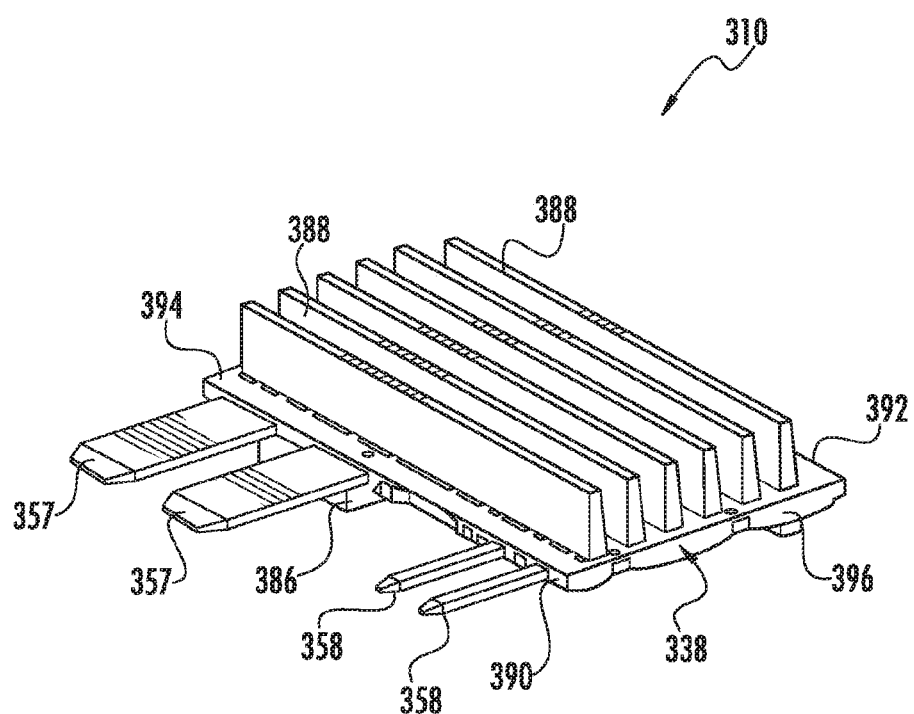
FIG. 8 is an alternative perspective view of the ASEP device of FIG. 7.

FIGS. 7 and 8 illustrate a preferred configuration of the ASEP device 310. The substrate 338 is formed with a plurality of heat dissipating fins 388 opposite a side of the substrate 338 upon which the electrical components 386 are mounted. The substrate 338 has a forward edge 390, a rearward edge 392, and first and second side edges 394, 396.

Figure 9:
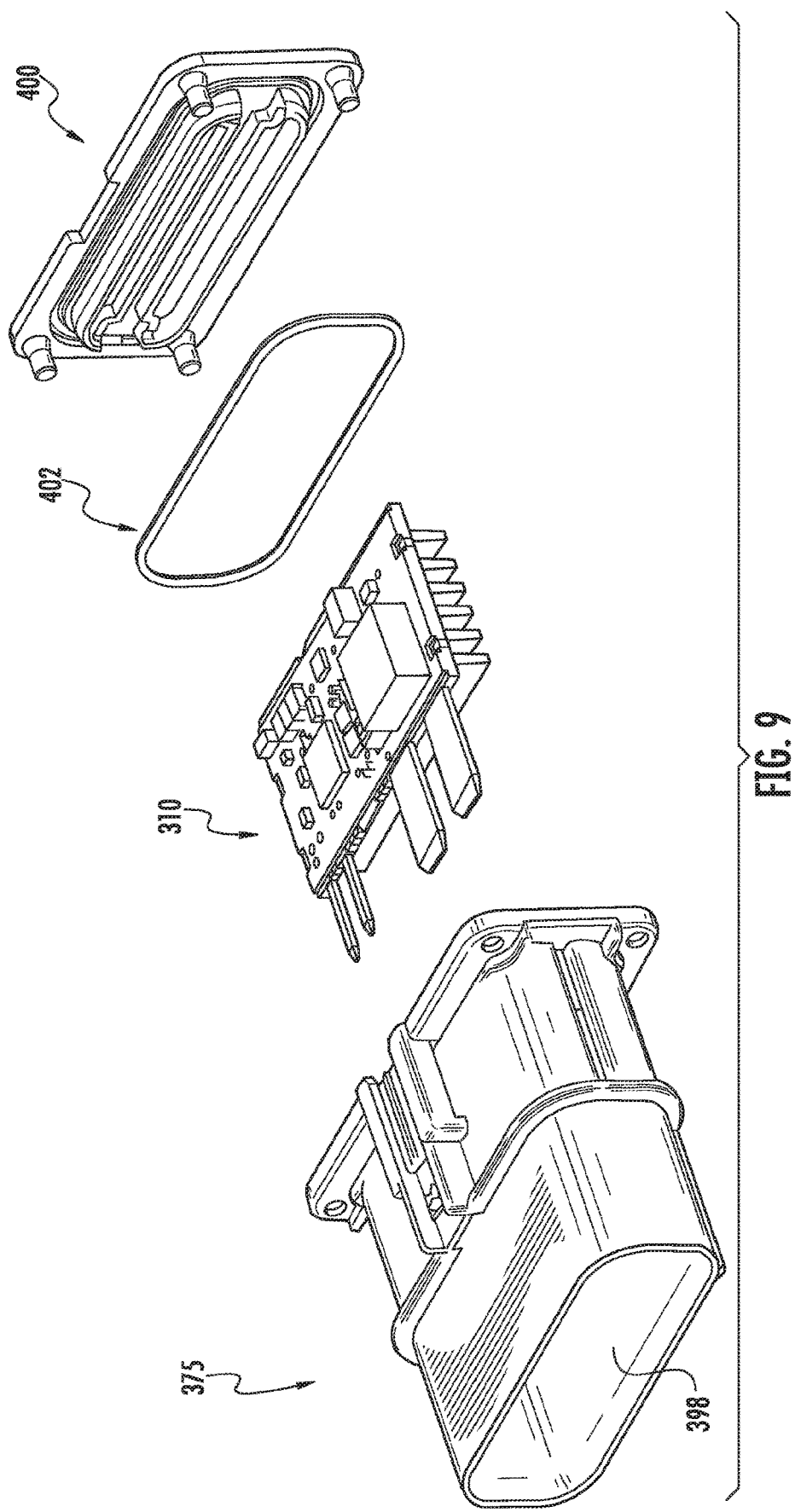
FIG. 9 is an exploded perspective view of the third embodiment of the micro power distribution box.
Figure 10:
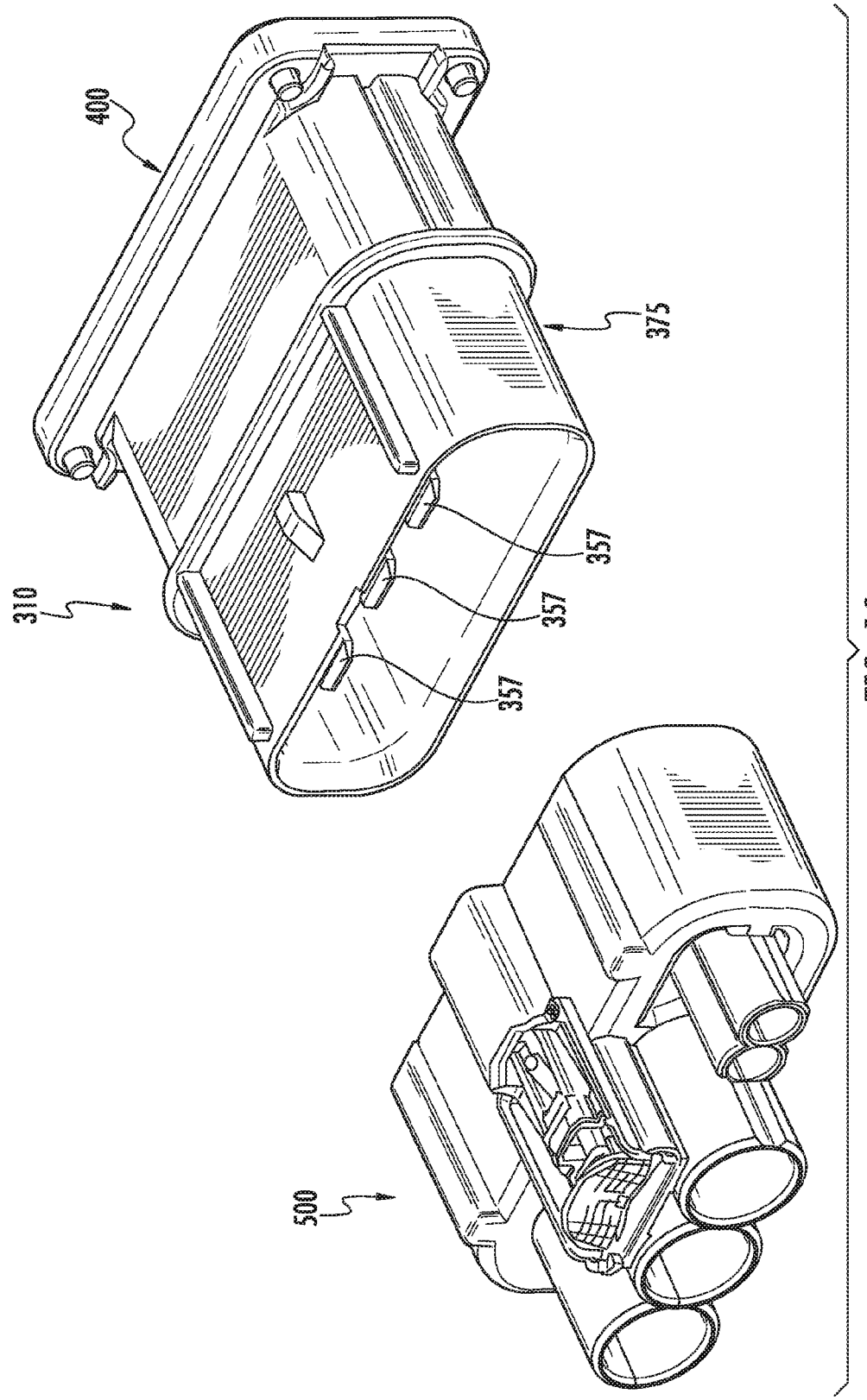
FIG. 10 is a perspective view of a connector assembly, in an unmated arrangement, including the third embodiment of the micro power distribution box and a mating connector.
Figure 11:
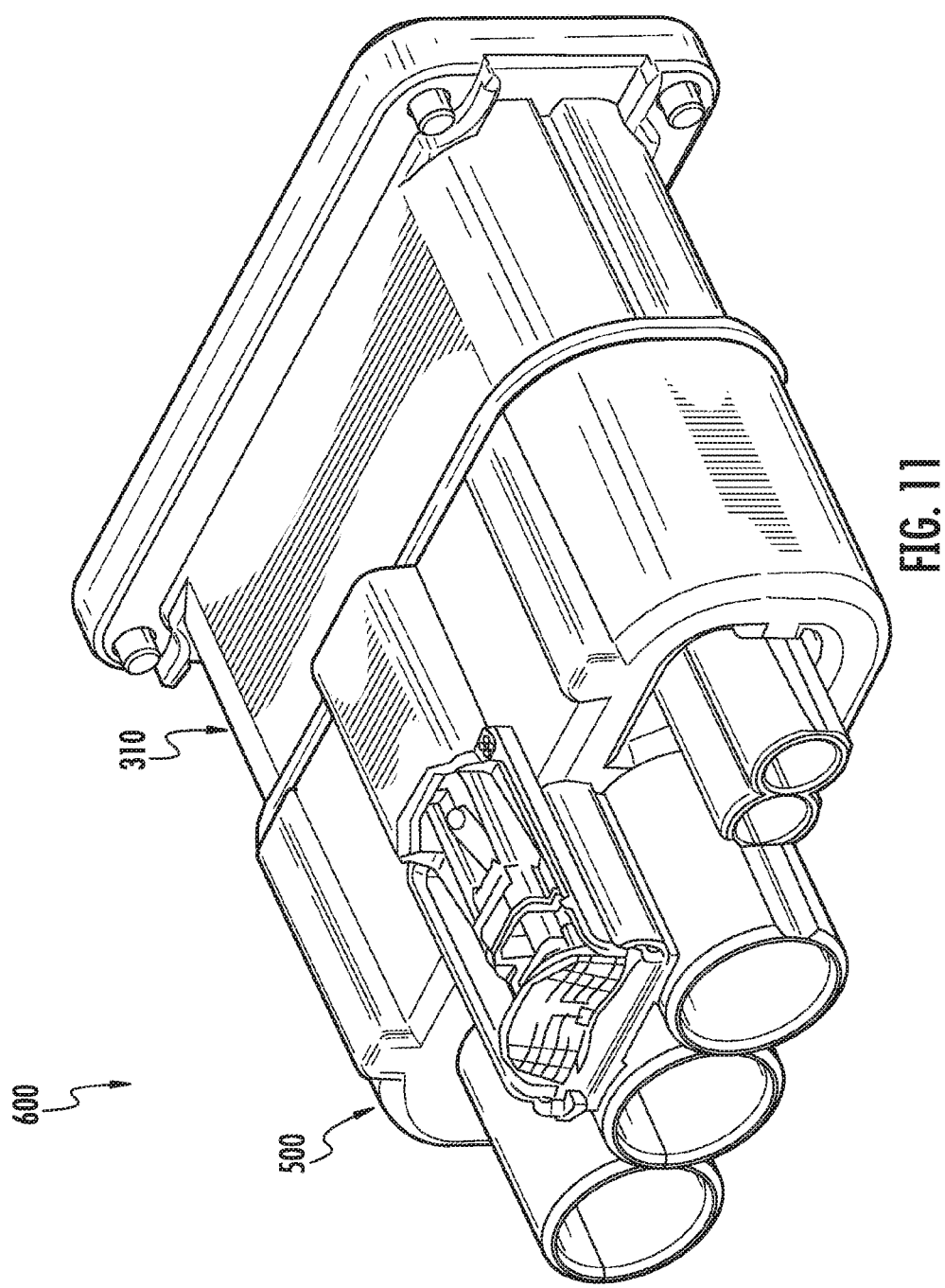
FIG. 11 is a perspective of the connector assembly of FIG. 10 is a mated arrangement.

FIGS. 9 and 10 illustrate the micro PDB 360. As illustrated, the connector/housing 375 includes a first inner portion (not shown) into which the ASEP device 310 is inserted and housed. The first and second side edges 394, 396 are preferably inserted into track portions (not shown) defined by the connector/housing 375 until the forward edge 390 abuts against an internal wall (not shown) of the connector/housing 375. The first inner portion has an opening such that the heat dissipating fins 388 of the substrate 338 are exposed. The internal wall separates the first inner portion from a second inner portion 398 of the connector/housing 375. The internal wall has a plurality of apertures (not shown) extending therethrough which allow the electroplated high current contacts 357 and the electroplated contact pins 358 to extend into the second inner portion 398.

As illustrated in FIG. 10, a cover 400 can be secured to the connector/housing 375 via known means to close off the first inner portion and, in essence, encapsulate the ASEP device 310 therein. The cover 400, as well as the internal wall, may be configured to have track portions to receive the rearward and forward edges 392, 390, respectively, such that the ASEP device 310 is stabilized in position. A gasket 402 may be provided between the cover 400 and the connector/housing 375 to seal off the ASEP device 310 from outside elements.

With the micro PDB 360 formed, it can be connected to a mating connector 500 which is configured to be electrically connected to the micro PDB 360 via the electroplated high current contacts 357 and the electroplated contact pins 358, thereby providing a connector assembly 600. The connector assembly 600, either via the micro PDB 360 or via the mating connector 500 (or both, if desired), can be mounted within a vehicle, typically to a panel, in a number of known ways.

Overall, the micro PDB 360 is approximately 55% smaller and approximately 60% lighter than known standard PDBs.

It should be noted that the substrate 338 of the ASEP device 310 could be formed to not have the heat dissipating fins 388. In such an instance, the connector/housing 375 would need to be modified such that the opening thereof which would allow for the exposure of the heat dissipating fins 388 would be removed.

It should further be noted that the ASEP device 310 illustrated in FIGS. 6-9 is illustrated with two electroplated high current contacts 357, while FIG. 10 is illustrated with three electroplated high current contacts 357. As such, it is to be understood that the ASEP device 310 may have any number of electroplated high current contacts 357 as desired.

The electrical components 286, 386 of the ASEP devices 210, 310, in addition to the high-power FET, may also preferably include an internal microprocessor for local interconnector network (LIN) control which can be programmed for a variety of functions.

The substrates 138, 238, 338 found in each of the ASEP devices 110, 210, 310 may also advantageously be formed with a thermally conductive liquid crystal polymer (LCP). By making the substrates 138, 238, 339 out of thermally conductive LCPs, the heat loads of the electronics can be significantly reduced in the ASEP devices 110, 210, 310 and, thus, the micro PDBs 160, 260, 360.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All processes described herein can be performed in any suitable order unless otherwise indicated herein or otherwise clearly contradicted by context. The use of any and all examples, or exemplary language (e.g., "such as") provided herein, is intended merely to better illuminate the invention, and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A micro power distribution box comprising:
a device having a substrate, a first finger, a second finger, and an electrical component, the first finger having first, second and third portions, the second finger having first, second and third portions, the substrate being overmolded to the first portions of the first and second fingers, the substrate not being overmolded to the second or third portions of the first and second fingers, the second portions of the first and second fingers extending outwardly from the substrate, the third portions of the first and second fingers being exposed via at least one aperture provided through the substrate, the electrical component being directly mounted to the third portions of the first and second fingers in order to electrically connect the electrical component to each of the first and second fingers;
a connector/housing which is configured to house the device therein and which is configured to be connected to a mating connector; and
a cover which is configured to be secured to the connector/housing in a manner which prevents the device from being removed from the connector/housing.

2. The micro power distribution box as defined in claim 1, wherein the substrate is formed of a thermally conductive liquid crystal polymer.

3. The micro power distribution box as defined in claim 1, wherein the electrical component comprises a high-powered field-effect transistor.

4. The micro power distribution box as defined in claim 1, wherein the at least one electrical component comprises an internal microprocessor.

5. The micro power distribution box as defined in claim 1, wherein the device is formed by an Application Specific Electronics Packaging manufacturing process.

6. The micro power distribution box as defined in claim 1, wherein the first finger and the second finger are electrically connected to one another via a bus bar.

7. The micro power distribution box as defined in claim 6, wherein the substrate is overmolded to the bus bar.

8. The micro power distribution box as defined in claim 1, further comprising a gasket which is secured between the cover and the connector/housing.

9. The micro power distribution box as defined in claim 1, wherein each of the first and second fingers are high current contacts.

10. The micro power distribution box as defined in claim 1, further comprising at least one third finger, the at least one third finger having first and second portions, the substrate being overmolded to the first portion of the at least one third finger, the substrate not being overmolded to the second portion of the at least one third finger, the second portion of the at least one third finger extending outwardly from the substrate.

11. The micro power distribution box as defined in claim 10, wherein the second portion of the at least one third finger is a contact pin.

12. The micro power distribution box as defined in claim 10, wherein the second portion of the at least one third finger is electroplated.

13. The micro power distribution box as defined in claim 1, wherein the second and third portions of the first and second fingers are electroplated.

14. The micro power distribution box as defined in claim 1, wherein the at least one aperture provided through the substrate comprises first and second apertures, the third portion of the first finger being exposed via the first aperture, the third portion of the second finger being exposed via the second aperture.

15. A method of forming a micro distribution box, the method comprising the steps of:
providing first and second fingers;
overmolding a substrate onto the first and second fingers, the substrate having at least one aperture provided therethrough which exposes a portion of the first finger and a portion of the second finger;
electroplating the exposed portions of the first and second fingers; and
directly mounting an electrical component to the exposed portions of the first and second fingers in order to electrically connect the electrical component to each of the first and second fingers to form a device;
housing the device within a connector/housing which is configured to be connected to a mating connector; and
securing a cover to the connector/housing in a manner which prevents the device from being removed from the connector/housing.

16. The method as defined in claim 15, wherein the electrical component is a high-powered field-effect transistor.

17. A method of forming a micro power distribution box, the method comprising the steps of:
forming a continuous carrier web having a plurality of lead frames, each lead frame defining an opening and having first and second fingers which extend into the opening;
overmolding a substrate onto the first and second fingers of each lead frame, each substrate having at least one aperture provided therethrough which exposes a portion of the first finger and a portion of the second finger;
electroplating the exposed portions of each of the first and second fingers; and
directly mounting an electrical component to the exposed portions of each of the first and second fingers in order to electrically connect a respective one of the electrical components to respective first and second fingers to form a plurality of devices;
singulating one of the devices from the continuous carrier web;
housing the singulated device within a connector/housing which is configured to be connected to a mating connector; and
securing a cover to the connector/housing in a manner which prevents the singulated device from being removed from the connector/housing.

18. The method as defined in claim 17, wherein the electrical component is a high-powered field-effect transistor.

* * * * *